US006406640B1

(12) United States Patent
Yang et al.

(10) Patent No.: US 6,406,640 B1
(45) Date of Patent: *Jun. 18, 2002

(54) PLASMA ETCHING METHOD

(75) Inventors: Chan-lon Yang, Los Gatos; Usha Raghuram, San Jose, both of CA (US); Kimberley A. Kaufman; Daniel Arnzen, both of Eden Prairie, MN (US); James Nulty, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/546,714

(22) Filed: Apr. 10, 2000

Related U.S. Application Data

(63) Continuation of application No. 08/935,705, filed on Sep. 23, 1997, now Pat. No. 6,165,375.

(51) Int. Cl.$^7$ .............................................. H01L 21/00
(52) U.S. Cl. ............................ 216/67; 216/79; 216/80; 438/710; 438/714; 438/723
(58) Field of Search ............................ 216/67, 79, 80; 438/710, 714, 723

(56) References Cited

U.S. PATENT DOCUMENTS

| | | | |
|---|---|---|---|
| 4,211,601 A | 7/1980 | Mogab | 156/643 |
| 4,256,534 A | 3/1981 | Levinstein et al. | 156/643 |
| 4,310,380 A | 1/1982 | Flamm et al. | 156/643 |
| 4,376,672 A | 3/1983 | Wang et al. | 156/643 |
| 4,412,885 A | 11/1983 | Wang et al. | 156/643 |
| 4,447,290 A | 5/1984 | Matthews | 156/626 |
| 4,483,737 A | 11/1984 | Mantei | 156/643 |
| 4,582,581 A | 4/1986 | Flanigan et al. | 204/192 |
| 4,617,079 A | 10/1986 | Tracey et al. | 156/345 |
| 4,659,426 A | 4/1987 | Fuller et al. | 156/643 |
| 4,666,555 A | 5/1987 | Tsang | 156/643 |
| 4,668,338 A | 5/1987 | Maydan et al. | 156/643 |
| 4,676,868 A * | 6/1987 | Riley et al. | 156/643 |
| 4,698,126 A | 10/1987 | Van Roosmalen et al. | 156/643 |
| 4,717,447 A | 1/1988 | Dieleman et al. | 156/643 |
| 4,978,420 A * | 12/1990 | Bach | 156/643 |
| 4,980,018 A | 12/1990 | Mu et al. | 156/643 |
| 5,034,092 A | 7/1991 | Lebby et al. | 156/646 |

(List continued on next page.)

FOREIGN PATENT DOCUMENTS

| | | |
|---|---|---|
| EP | 0 078 161 | 5/1983 |
| EP | 0 109 706 | 5/1984 |
| EP | 0 260 201 B1 | 3/1988 |
| EP | 0 383 570 A2 | 8/1990 |
| EP | 0 504 758 A2 | 9/1992 |
| EP | 0 520 519 A1 | 12/1992 |
| EP | 0 558 238 B1 | 1/1993 |
| EP | 0 558 238 A1 | 9/1993 |
| EP | 0 680 072 A2 | 11/1995 |
| EP | 0 683 512 A2 | 11/1995 |
| EP | 0 691 678 A2 | 1/1996 |
| EP | 0 731 501 A1 | 9/1996 |

OTHER PUBLICATIONS

Schravendijk, et al., The Role of Carbon in PECVD TEOS Films.

Roy, Plasma Etching and Semiconductor Devices in Vacuum Background, Bulletin I.V.S., vol. 19, pp. 3–16, Sep. 1988.

Foad, et al., Defect Penetration During the Plasma Etching of Semiconductors, Mat.Res.Soc.Symp.Proc. vol. 279, pp.775–780 (1993).

Voshchenkov, Plasma Etching: An Enabling Technology for Gigahertz Silicon Integrated Circuits, J.Vac.Sci. Technol. A11(4),Jul./Aug. 1993, pp. 1211–1220.

Nafis, et al., In Situ Studies of Electron Cyclotron Resonance Plasma Etching of Semiconductors by Spectroscopic Ellipsometery, Mat.Res.Soc.Symp.Proc vol.279, 1993, pp. 819–824.

Voshchenkov, Fundamentals of Plasma Etching for Silicon Technology (Part 1), International Journal of High Speed Electronics, vol. 1, Nos. 3 & 4 (1990) 303–345.

Voshchenkov, Fundamentals of Plasma Etchnig for Silicon Technology (Part 2), International Journal of High Speed Electronics, vol. 2, Nos. 1 & 2 (1991) 45–88.

IBM Technical Disclosure Bulletin, vol. 28, No. 9, Feb. 1986, p.3921.

Reksten, et al., Wavelength Dependence of Laser Enhanced Plasma Etching of Semiconductors, Appl. Phys.Lett.48(8), Feb. 24, 1986, pp. 551–553.

Burton, et al. $CCl_4$ and $Cl_2$ Plasma Etching of III–V Semiconductors and the Role of Added $O_2$, Electron Sensitive Positive Resists, vol. 129, No. 7, pp. 1599–1604.

Booth, et al., Application of Plasma Etching Techniques to Metal–Oxide–Semiconductor (MOS) Processing, Thin Solid Films, 65 (1980) 111–123.

Kalter, et al., Plasma Etching in IC Technology, Philips tech. Rev. 38, 200–210. 1978/79, No. 7/8, pp. 200–210.

Parry, et al. Anisotropic Plasma Etching of Semiconductor Materials, Solid State Technology, Apr. 1979, pp. 125–137.

Jacob, The Versatile Technique of RF Plasma Etching, Solid State Technology/Apr. 1978, pp. 95–98–cont'd.p.121.

Neitzert, Laser Pulse Induced Microwave Conductivity and Spectroscopic Ellipsometery Characterization of Helium and Hydrogen Plasma Damage of the Crystalliine Silicon Surface, Materials Science Forum Vols., 173–174(1995), pp. 209–214.

(List continued on next page.)

Primary Examiner—Randy Gulakowski
Assistant Examiner—Allan Olsen
(74) Attorney, Agent, or Firm—Oblon, Spivak, McClelland, Maier & Neustadt, P.C.

(57) ABSTRACT

The present invention relates to a method of plasma etching and a method of operating a plasma etching apparatus in which a concentration of oxygen at flash striking is greater than a concentration during etching.

14 Claims, No Drawings

U.S. PATENT DOCUMENTS

| | | | |
|---|---|---|---|
| 5,045,150 A | 9/1991 | Cleeves et al. | 156/643 |
| 5,236,537 A | 8/1993 | Asaka | 156/345 |
| 5,238,532 A | 8/1993 | Zarowin et al. | 156/643 |
| 5,240,555 A | 8/1993 | Kilburn | 156/643 |
| 5,296,094 A * | 3/1994 | Shan et al. | 156/651 |
| 5,298,465 A | 3/1994 | Levy | 437/225 |
| 5,354,386 A | 10/1994 | Cheung et al. | 148/33.3 |
| 5,405,491 A | 4/1995 | Shahvandi et al. | 156/643 |
| 5,435,886 A | 7/1995 | Fujiwara et al. | 156/643.1 |
| 5,441,596 A | 8/1995 | Nulty | 156/643.1 |
| 5,468,342 A | 11/1995 | Nulty et al. | 156/643.1 |
| 5,514,247 A | 5/1996 | Shan et al. | 156/651 |
| 5,543,336 A | 8/1996 | Enami et al. | 437/24 |
| 5,562,801 A | 10/1996 | Nulty | 156/643.1 |
| 5,869,401 A * | 2/1999 | Brunemeier et al. | 438/710 |
| 6,066,555 A * | 5/2000 | Nulty et al. | 438/634 |
| 6,165,375 A * | 12/2000 | Yang et al. | 216/67 |

OTHER PUBLICATIONS

Osadchuk, Apparatus for Studying Relaxation Processes in a Low–Temperature Plasma by the Photon Counting Method, Translated from Izmeritl'naya Tekhnika, No. 1, pp. 25–26, Jan., 1989, pp. 39–41.

Brandt, et al., Kinetic Studies on $CF_4$ Plasmas During Etching of Si, Plasma Chemistry and Plasma Processing, vol. 3, No. 3, 1983, pp. 337–342.

* cited by examiner

PLASMA ETCHING METHOD

This application is a Continuation of application Ser. No. 08/935,705 Filed on Sep. 23, 1997, now U.S. Pat. No. 6,165,375.

BACKGROUND OF THE INVENTION

1. Field of the Invention:

The present invention relates to a method of plasma etching and a method of operating a plasma etching apparatus.

2. Discussion of the Background:

In the fabrication of semiconductor devices, numerous conductive device regions and layer are formed in or on a semiconductor substrate. The conductive regions and layers of the device are isolated from one another by a dielectric, for example, silicon dioxide. The silicon dioxide may be grown, or may be deposited by physical deposition (e.g., sputtering) or by a variety of chemical deposition methods and chemistries. Additionally, the silicon dioxide may be undoped or may be doped, for example, with boron, phosphorus, or both, to form for example, borophosphosilicate glass (BPSG), and phosphosilicate glass (PSG). The method of forming the silicon dioxide layer and the doping of the silicon dioxide will depend upon various device and processing considerations. Herein, all such silicon dioxide layers are referred to generally as "oxide" layers.

At several stages during fabrication, it is necessary to make openings in the dielectric to allow for contact to underlying regions or layers. Generally, an opening through a dielectric layer between polysilicon and the first metal layer is called a "contact opening", while an opening through oxide layers such as an opening through an intermetal dielectric layer (ILD) is referred to as a "via". As used herein, an "opening" will be understood to refer to any type of opening through any type of oxide layer, regardless of the stage of processing, layer exposed. or function of the opening.

During semiconductor manufacturing, it is typically necessary to conduct selective etching of material such as in the formation of contacts. A common technique for etching overlaying dielectric layers is photolithography, in which light is used to form a pattern on a photosensitive film which has been deposited on the surface of a dielectric layer. Development of the resist results in a pattern, in which portions of the oxide are exposed. The exposed portions of the oxide may then be subject to selective etching to form a contact.

Etching may be conducted by many methods, however, plasma based processes such as plasma enhanced chemical vapor deposition and reactive ion etching (RIE) are very common. Typically, the plasma is generated by coupling radio frequency (RF) electromagnetic energy to the plasma. The RF energy is supplied by an RF generator coupled to a power supply. Because the plasma has a variable impedance, a matching network is employed to match the impedance of the power supply with that of the plasma. The matching network may include one or more capacitors and one or more inductors to achieve the match and thereby tune the RF power. Typically, the tuning may be done automatically by an automatic matching network (AMN). When tuned, most of the power output of the RF generator is coupled to the plasma. The power to the plasma is often referred to as forward power.

However, etching of wafers to form contact openings is sometimes complicated by the redeposition of species which have a volatility sufficiently low to lead to localized micromasking effects called grass. The redeposited species act as a local mask while the surrounding area is being etched away by surface gasification. By the time the localized masks get removed the surface area is very rough and appears to have grass-like features sticking up from the bottom. Processing efforts designed to consistently eliminate or minimize the formation of such seal ring residues and grass have been met with little success.

Many of the etch characteristics are generally believed to be affected by polymer residues which deposit during the etch. For this reason, the fluorine to carbon ratio (F/C) in the plasma is considered an important determinant in the etch. In general, a plasma with a high F/C ratio will have a faster etch rate than a plasma with a low F/C ratio. At very low F/C ratios (i.e., high carbon content), polymer deposition may occur and etching may be reduced. The etch rate as a function of the F/C ratio is typically different for different materials. This difference is used to create a selective etch, by attempting to use a gas mixture which puts the F/C ratio in the plasma at a value that leads to etching at a reasonable rate for one material, and that leads to little or no etching or polymer deposition for another.

In addition, excessive net polymer deposits sometimes occurs while the Rf component of the etch system is stabilizing at the target value. For a more thorough discussion of oxide etching, see S. Wolf and R. N. Tauber, *Silicon Processing for the VLSI ERA,* Volume 1, pp 539–585 (1986).

The introduction of oxygen into an etching process has been reported to allow for control of the anisotropy, by varying the fraction of $O_2$ in the feed (see for example Burton et al J. Electrochem. Soc.: Solid-State Science and Technology, v 129, no 7, 1599 (1982)).

Accordingly, a plasma etching method which provides for reliable etching of a dielectric layer which does not suffer from a residue formation problem is sought.

The inventors of the present invention have discovered that grass formation can be reduced and nearly eliminated by the addition of $O_2$ during the striking of the plasma.

SUMMARY OF THE INVENTION

One aspect of the present invention is directed to a method of plasma etching a dielectric layer.

Another embodiment of the present invention is directed to a method of operating a plasma etching apparatus.

These and other aspects of the present invention are made possible by a process in which a plasma is formed by flash striking in the presence of oxygen, wherein the amount of oxygen present during striking is greater than the amount after striking. The inventors have discovered that the presence of oxygen during (and optionally, before) the striking of the plasma greatly reduces the formation of grass deposits in the etched portions, eliminating the need for further cleaning steps.

DETAILED DESCRIPTION OF THE PREFERRED EMBODIMENTS

The substrate to be etched may be a typical dielectric layer having a patterned photoresist thereon.

Suitable dielectric materials may be those dielectric materials conventionally known to those of ordinary skill in the art. Non-limiting examples of suitable dielectric layers include a $SiO_2$ based layer such as silicon dioxide (which may be conventionally doped with boron and/or phosphorous; e.g. borophosphosilicate glass (BPSG), borosilicate glass (BSG), and phosphosilicate glass (PSG), silicon nitride ($Si_xN_y$), a conventional oxide/nitride/oxide structure, low K dielectrics such as $SiO_2$ doped with either F, Cl or both, spin-on glass (SOG), a silicon oxynitride (e.g. of the general formula $[Si_aO_xN_y]$ such that $(x/2)+(3y/4)=a$), $Al_2O_3$, metal nitrides such as aluminum nitride [e.g. AlN], $V_2O_5$, tetraethylorthosilicate (TEOS)-based oxides which may be doped with boron (B) and/or phosphorous (P) (such as BPTEOS films), and titanium oxide, aluminum oxynitrides (e.g. of the general formula $[Al_bO_xN_y]$ such that $(2x/3)+y=b$), aluminosilicates and nitrides thereof (e.g. of the general formula $[Si_aAl_bO_xN_y]$ where $x=2a+3b/2$ and $y=4a/3+b$), and boron- and/or phosphorous-doped aluminates and aluminosilicates. More preferably the dielectric layer is $SiO_2$ or $SiO_2$ doped with boron (B) and/or phosphorous (P). In a most preferred embodiment, the dielectric material is a BPTEOS film.

When the dielectric material is BPTEOS, the dielectric layer may further comprise a capping layer prepared from TEOS, which can act to stabilize the BPTEOS layer during processing and/or prevent etching and/or migration of dopants from the BPTEOS layer into a subsequently deposited layer. When present, a capping layer may be etched in a first stage, under optimum etching conditions which are not necessarily the optimum etching conditions for the underlying BPTEOS layer. After the capping layer has been etched, the underlying BPTEOS layer may be etched by the $O_2$ plasma striking method.

The thickness of the dielectric film is not particularly limited and is preferably a thickness of 0.1–5 µm.

Generally, an opening through a dielectric exposing a diffusion region or an opening through a dielectric layer between (a) a semiconductor substrate or a polysilicon layer and (b) the first metal layer is called a "contact opening", while an opening in other oxide layers such as an opening through an intermetal dielectric layer is referred to as a "via" or "via channel". As used herein, an "opening" will be understood to refer to any type of opening through any type of dielectric layer, regardless of the layer exposed or function of the opening. Furthermore. a "(semi)conductive layer" refers to a layer of either a conventional semiconductive material (that may be conventionally doped) or a conventional conductive material.

The dielectric layer to be etched may overlie an underlying conductive region such as a semiconductor substrate, a source or drain region, the gate material of the gate electrode, or a conductive material. Non-limiting examples of suitable conductive regions include a metal such as aluminum, polysilicon (which may be conventionally doped with n-dopants such a phosphorous, arsenic, antimony, sulfur, etc. or with p-dopants such as boron), titanium, tungsten, copper, conductive alloys thereof such as aluminum-copper and titanium-tungsten alloy, etc., and conductive compounds, such as tungsten silicide.

The surface of the dielectric layer may be patterned with a photoresist. Suitable photoresist materials are those conventionally known to those of ordinary skill in the art and may comprise either positive or negative photoresist materials. Either or both positive and/or negative resist layers may be used.

The photoresist may be applied by conventional methods known to those of ordinary skill in the art. Non-limiting examples of suitable techniques for applying a photoresist will include spraying, roller coating and spin coating. In a preferred embodiment, spin coating is used to deposit the photoresist film. The thickness of the photoresist material may vary depending upon the application. However, generally a resist having a thickness of at least 500 nm, more preferably 700 nm to 1.5 µm, is used.

Negative resist materials may contain chemically inert polymer components such as rubber and/or photoreactive agents that react with light to form cross-links, e.g. with the rubber. When placed in an organic developer solvent, the unexposed and unpolymerized resist dissolves, leaving a polymeric pattern in the exposed regions. The preparation of suitable negative resist materials is within the level of skill of one of ordinary skill in the art without undue experimentation. Specific non-limiting examples of suitable negative resist systems include cresol epoxy novolac-based negative resists as well as negative resists containing the photoreactive polymers described in Kirk-Othmer Encyclopedia of Chemical Technology, 3rd Edition, vol 17, entitled "Photoreactive Polymers", pages 680–708, the relevant portions of which are hereby incorporated by references.

Positive resists have photoreactive components which are destroyed in the regions exposed to light. Typically the resist is removed in an aqueous alkaline solution, where the exposed region dissolves away. The preparation of suitable positive resist materials is within the level of skill of one of ordinary skill in the art without undue experimentation. Specific non-limiting examples of suitable positive resist systems include Shipley XP9402, JSR KRK-K2G and JSR KRF-L7 positive resists as well as positive resists containing the photoreactive polymers described in Kirk-Othmer Encyclopedia of Chemical Technology, 3rd Edition, vol 17, entitled "Photoreactive Polymers", pages 680–708, the relevant portions of which are hereby incorporated by references.

Exemplary resist materials are also described by Bayer et al, IBM Tech. Discl. Bull. (USA) vol. 22, No. 5, (Oct. 1979), pp. 1855; Tabei, U.S. Pat. No. 4,613.404; Taylor et al, J. Vac. Sci., Technol. B. Vol. 13, No. 6, (1995), pp. 3078–3081; Argritis et al, J. Vac. Sci., Technol. B., Vol. 13, No. 6, (1995), pp. 3030–3034; Itani et al, J. Vac. Sci, Technol. B. Vol 13, No. 6, (1995), pp. 3026–3029; Ohfuli et al, J. Vac. Sci, Technol. B. Vol. 13, No. 6, (1995), pp. 3022–3025; Trichkov et al, J. Vac. Sci., Technol. B. Vol. 13, No. 6, (1995), pp. 2986–2993; Capodieci et al, J. Vac. Sci, Technol. B. Vol. 13, No. 6, (1995), pp. 29632967; Zuniga et al, J. Vac. Sci, Technol. B. Vol. 13, No. 6, (1995), pp. 2957–2962; Xiao et al, J. Vac. Sci, Technol. B. Vol. 13, No. 6, (1995) pp. 2897–2903; Tan et al J. Vac. Sci, Technol. B. Vol. 13, No. 6, (1995), pp. 2539–2544; and Mayone et al J. Vac. Sci, Technol. Vol. 12, No.6, pp. 1382–1382. The relevant portions of the above-identified references which describe the preparation of resist materials are hereby incorporated by reference. Specific examples of resist materials are JSR and Mitsubishi resist materials.

It is also within the scope of the present invention to use an adhesion enhancing agent in the photoresist material to promote the adhesion of the photoresist to the underlying dielectric material. The adhesion enhancing agent may be added to the photoresist material or may be applied as a separate layer between the photoresist and the underlying dielectric material layer. Such adhesion enhancing agents include those conventionally known to those of ordinary skill in the art.

Patterning and developing of the resist material may be conducted by conventional methods known to those of ordinary skill in the art. In a preferred embodiment, after patterning and developing but prior to plasma etching, hard baking of the resist may be conducted by conventional methods known to those of ordinary skill in the art. Hard baking is typically performed sufficiently to prevent photoresist lifting from the underlying dielectric layer during wet etching, for example for about 30 minutes–1 hour at a temperature of 110–120° C. more specifically about 40 minutes at 115°.

In a preferred embodiment, the developed resist material is subjected to a "descum" process comprising exposing the wafer to an $O_2$ plasma sufficiently to remove residual portions of the resist material from the surface of the exposed dielectric. Non-limiting descumming conditions include exposing for about 5 min at about 0.6 torr, in an $O_2$ or $O_2$-containing atmosphere at about 100 watts power.

The pattern of the patterned resist material is not particularly limited. However, in a preferred embodiment, the pattern will have a lateral/vertical (L/V) ratio of >1:1.

After the resist material has been patterned and developed, the substrate is ready for plasma etching. A method for forming a stable plasma is disclosed. In the following description, numerous specific details are set forth such as specific materials, parameters, equipment, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

Typical conditions for striking a plasma occur under low pressure (e.g from 20 to 200 mTorr, preferably 30 to 150 mTorr, more preferably 40 to 100 mTorr), for example, approximately 50 to 90 mTorr or less, and/or under high power (e.g. 250 watts or more. preferably 300 to 800 watts), for example, approximately 500 to 600 watts. The difficulty in igniting and tuning a plasma may vary from system to system, but in any given system, difficulty is more likely to be encountered at the lower end of the pressure operating range and the higher end of the power operating range, particularly when the process operates at both the low pressure and the high power ends of the operating ranges.

The duration of the flash strike will typically be within the range of from 2 to 20 seconds, preferably from 3 to 15 seconds, more preferably 3 to 10 seconds. In one embodiment, the flash striking step is conducted for approximately 6 seconds.

Plasma etching conditions are otherwise those conventionally used by those of ordinary skill in the art in plasma etching. Non-limiting examples of dry isotropic etch machines include CTI Drytek (available from DRYTEK, Inc. of Wilmington, Mass. and Santa Clara, Calif.) and Aspen Lite Etch (available from Mattson Technology, Inc. of Fremont, Calif.). Dry etching may also be conducted by conventional RF or dual RF etching. In a preferred embodiment, etching is conducted using a commercially available plasma etcher and a $CHF_3/C_2F_6$ etch chemistry according to the manufacturer's instructions. For example, the invention may be practiced with a conventional diode, triode, magnetic enhanced reactive ion etcher (MERIE), microwave etching apparatus or HDP (High Density Plasma) reactor; in one embodiment the present invention is practiced on a Drytek Triode 384T system, e.g. from DRYTEK, Inc. of Wilmington, Mass. and Santa Clara, Calif.

Suitable powers for etching include an RF power of 150 to 1,000 W, preferably 200 to 800 W, more preferably 300 to 600 W. In a dual RF embodiment (i.e. wherein the plasma is formed at a first relatively low radio frequency and, simultaneously, a second, relatively high radio frequency; see e.g. U.S. Pat. No. 5,441,596), the low frequency power maybe from 400 to 1,000 W, preferably 500 to 900 W, more preferably 525 to 850 W, and the high frequency power may be from 100 to 600 W, preferably 100 to 500 W, more preferably 150 to 475 W.

The etching gas may be those typically used by those of ordinary skill in the art in conventional reactive ion etching. Typically, halocarbons such as $CHF_3$, $C_2F_6$, F-134, F-134a, $CF_4$, $SF_6$, $NF_3$, $SF_6$, $Cl_2$, HF, HCl, $CCl_4$, $C_nH_xF_y$ (where $n \geq 1$, $y \geq 1$, and x+y=2n+2) and mixtures thereof, preferably $CHF_3$, $C_2F_6$ and/or F134(a) and more preferably a mixture of $CHF_3/C_2F_6$ (see, for example, U.S. Pat. Nos. 08/683,407 and/or 5,468,342, the relevant portions of which are hereby incorporated by reference). Within the context of the present invention, the term "etching gas" refers to the components of the gas which produce etching of the dielectric and flow rates of etching gases describe herein do not include oxygen or make up gases.

It is also within the scope of the present invention to introduce into the etching apparatus, a polymer forming gas, which is any gas which is likely to form a polymer in the etching chamber such as a hydrofluorocarbon, preferably a $C_{1-4}$ hydrofluorocarbon, and even more preferably F-134a.

The total flow rate of etching gas before the flash striking step is typically 5 to 500 SCCM, more preferably 15 to 300 SCCM and even more preferably 25 to 250 SCCM. Of this flow, anywhere from 4 to 450 SCCM, preferably from 8 to 200 SCCM may comprise a carrier gas such as Ne, Kr, Xe, CO, $CO_2$, $SO_2$, He, Ar, $N_2$ and mixtures thereof. Typically, the total flow rate of etching gas before striking the plasma is about the same or slightly more than the total flow rate of etching gas used during the flash strike and subsequent etching process(es).

Prior to or during the flash strike step, oxygen or an oxygen containing gas is introduced to the reactor at a flow of e.g. 1 to 50 SCCM, preferably 3 to 30 SCCM, more preferably, 5 to 20 SCCM. Suitable sources of oxygen comprise $O_2$, $O_3$, $N_2O$ and $N_2O_3$. The amount of oxygen present in the plasma gas during striking is greater than the amount of oxygen present during subsequent etching, preferably at least 1% greater, more preferably 5% greater, and even more preferably 10% greater than the amount of oxygen present during a subsequent etching step.

After the plasma is struck, the flow of the etching gas may be adjusted to flow rates providing the desired level of etching. In addition, the concentration of oxygen may be reduced, preferably by reducing or shutting off the flow of $O_2$ or oxygen-containing gas. After the plasma has been struck, the amount of oxygen in the etching gas may be reduced to zero. In one embodiment, the flow of (hydro) fluorocarbon etching gas may be adjusted to a total of from 0 to 70 SCCM, preferably 15 to 50 SCCM, more preferably 25 to 40 SCCM. In a preferred embodiment, the etchant gas comprises a mixture of at least one $C_1$ (hydro)fluorocarbon and at least one $C_{2-4}$ (hydro)fluorocarbon wherein the flow of $C_{2-4}$ (hydro)fluorocarbon is increased from a first relatively low value of 0 to 10 SCCM, preferably 1 to 5 SCCM, during the flash strike step to a second, relatively high value of 3 to 20 SCCM, preferably 5 to 15 SCCM, during subsequent etching. In a more preferred embodiment, the $C_1$ (hydro)fluorocarbon comprises $CHF_3$ and the $C_{2-4}$ (hydro) fluorocarbon comprises F-134a in amounts such that the vol % ratio of F-134a to $CHF_3$ increases from about 0:1 to about 1:1, preferably 0.1:1 to 0.5:1, during the flash strike to about 0.2:1 to 2:1, preferably about 0.25:1 to 1:1 during subsequent etching.

After an oxygen source has been introduced, the plasma may be struck by a flash strike technique, known to those of ordinary skill in the art. Typically, the plasma is flash struck by introduction of a spark to the plasma under the appropriate power conditions.

Selection of reaction conditions such as RF power, pressure and bias will vary depending on the reactor used and the etchant species, the selection of such parameters being within the level of ordinary skill to the artisan.

To achieve the desired etching results, it is desired to carry out the etch at a pressure of approximately 100 m Torr or less, and a power of approximately 400 Watts or more, to achieve better performance in etch characteristics such as selectivity, minimum feature size, minimal undercutting, selectivity, improved process latitude, and other characteristics. However, striking and tuning a plasma in this range is typically very difficult, and, even if the plasma is struck inconsistent results can normally be expected due to the earlier described problems in effectively tuning the RF power. Therefore, the RF power is turned on at a relatively low power level and a relatively high pressure level. For example, in one embodiment the RF power is 300 Watts and the pressure is 150 m Torr. In one embodiment, the etchant gas mixture comprises a flow of 40 standard cubic centimeters per minute (SCCM) $CHF_3$ (Freon 23), 10 SCCM $C_2F_6$ (Freon 116), and 3 SCCM of $C_2H_2F_4$ (Freon 134a). Oxygen is present in an amount of 10 SCCM. Under these conditions, the plasma may easily be started (e.g. by flash striking) with low voltage transients. Next, the plasma is allowed to stabilize (i.e., the plasma is run until a consistent plasma condition is achieved) without tuning. Because the process parameters described above in conjunction with low RF power result in low DC bias voltage conditions, the plasma is quickly stabilized. For example, this step may last approximately 1–30 seconds.

The vol % ratio of $O_2$ to $C_{2-4}$ (hydro)fluorocarbon (e.g. F-134a) when the plasma is struck is typically in, but not necessarily limited to the range of from 0.3:1 to 12:1.

The vol % ratio of the sum of $O_2$ and $C_{2-4}$ (hydro)fluorocarbon (e.g. F-134a) to $C_1$ (hydro)fluorocarbon (e.g. $CHF_3$) when the plasma is struck is typically in, but not necessarily limited to the range of 0.1:1 to 2.2:1.

The vol % ratio of $C_{2-4}$ (hydro)fluorocarbon (e.g. F-134a) to $C_1$ (hydro)fluorocarbon (e.g. $CHF_3$) when the plasma is struck is typically in, but not necessarily limited to the range of 1.2:1 to 18:1.

The vol % ratio of $O_2$ to the sum of $C_{2-4}$ (hydro)fluorocarbon (e.g. F-134a) and $C_1$ (hydro)fluorocarbon (e.g. $CHF_3$) when the plasma is struck is typically in, but not necessarily limited to the range of 0.1:1 to 1.2:1.

Examples of RIE conditions may include an RF power of from 500–800 watts, preferably 600–700 watts; a total pressure of about 50–200 mTorr, preferably 60–150 mTorr, more preferably about 75–135 mtorr and even more preferably about 80–130 mTorr; and a bias of 600–1,600 volts, preferably 800–1,200 volts and more preferably 1,000–about 1,100 volts. Examples of diode plasma etching may include a voltage of about 100 volts and a pressure of from 1–10 torr.

Such etching conditions when used in combination with a "high-selectivity" mixture of $C_2F_6$ and $CHF_3$ may produce an etching selectivity of dielectric material and/or passivation layer(s) to anti-reflective coating/etch stop layer(s) of preferably ≥5:1, more preferably ≥10:1, even more preferably ≥20:1, and most preferably ≥30:1.

Preferably etching of the dielectric material and/or passivation layer(s) is conducted under conditions which do not result in substantial etching of the conductive material layer. It is more preferably for etching of the dielectric material and/or passivation layer(s) to be conducted under conditions which leaves the anti-reflective coating/etch stop layer(s) substantially unetched.

The etching process of the present invention may be used in any etching process practiced in the area of semiconductor processing. In particular the present process may be used to practice SAC etching of a dielectric and open frame etching.

Accordingly, to another embodiment of the present invention is a method of operating a plasma etching apparatus in which, oxygen is present in the etching gas, during striking, in amount greater than the amount of oxygen present during etching.

Having generally described this invention, a further understanding can be obtained by reference to certain specific examples which are provided herein for purposes of illustration only and are not intended to be limiting unless otherwise specified.

TABLE 1

Etch recipe used for etching the wafers

|  | TEOS Etch | Flash Strike | BPTEOS Etch |
|---|---|---|---|
| Ar flow sccm | 0 | 52 | 52 |
| $C_2F_6$ flow sccm | 14 | 0 | 0 |
| $CHF_3$ flow sccm | 99 | 25 | 25 |
| F134a flow sccm | 0 | 3 | 12 |
| $O_2$ flow sccm | 0 | 5 | 0 |
| Pressure | 80 mTorr | 70 mTorr | 70 mTorr |
| He Pressure | 12 T | 10 T | 10 T |
| Power | 600 W | 325 W | 550 W |
| Stab. Time | 20 s | 20 s | 0 s |
| Etch time | 0:38 | 0:06 | 3:30 |
| LE temp | 35° C. | 35° C. | 35° C. |

The etching process was insensitive to variations in the BPTEOS film properties of the incoming wafers.

Wafers were prepared by using the conditions which produced the worst grass in a BPTEOS study ($N_2O$ flow= 12.5 lt/min; P=4.7%; B=6.2%). The wafers used in this study had a stack of 9K of reflowed BPTEOS and 2K of TEOS. These wafers were then patterned with a contact mask and hard baked prior to etching. The variety of conditions for the flash strike step conditions for etching the TEOS and BPTEOS layers are given in the Table 1 above summarized in Table 2 below. After etching, the wafers were stripped using a 2 μm ash strip program and inspected in a JEOL SEM for grass in the seal rings and contacts.

TABLE 2

| 1 | 2 | 3 | 4 | 5 | 6 | 7 |
|---|---|---|---|---|---|---|
| Run No. | Time (sec) | RF Power (W) | Pressure mTorr | $O_2$ (sccm) | $CHF_3$ (sccm) | Ar (sccm) | F134a (sccm) |

| Run No. | Time (sec) | RF Power (W) | Pressure mTorr | $O_2$ (sccm) | $CHF_3$ (sccm) | Ar (sccm) | F134a (sccm) |
|---|---|---|---|---|---|---|---|
| 1 | 2 | 300 | 50 | 20 | 35 | 100 | 2 |
| 2 | 10 | 300 | 50 | 5 | 15 | 100 | 12 |
| 3 | 2 | 550 | 50 | 5 | 35 | 10 | 12 |
| 4 | 10 | 550 | 50 | 20 | 15 | 10 | 2 |
| 5 | 2 | 300 | 90 | 20 | 15 | 10 | 12 |
| 6 | 10 | 300 | 90 | 5 | 35 | 10 | 2 |
| 7 | 2 | 550 | 90 | 5 | 15 | 100 | 2 |
| 8 | 10 | 550 | 90 | 20 | 35 | 100 | 12 |
| 9 | 10 | 550 | 90 | 5 | 15 | 10 | 12 |

TABLE 2-continued

| Run No. | 1 Time (sec) | 2 RF Power (W) | 3 Pressure mTorr | 4 O₂ (sccm) | 5 CHF₃ (sccm) | 6 Ar (sccm) | 7 F134a (sccm) |
|---|---|---|---|---|---|---|---|
| 10 | 2 | 550 | 90 | 20 | 35 | 10 | 2 |
| 11 | 10 | 300 | 90 | 20 | 15 | 100 | 2 |
| 12 | 2 | 300 | 90 | 5 | 35 | 100 | 12 |
| 13 | 10 | 550 | 50 | 5 | 35 | 100 | 2 |
| 14 | 2 | 550 | 50 | 20 | 15 | 100 | 12 |
| 15 | 10 | 300 | 50 | 20 | 35 | 10 | 12 |
| 16 | 2 | 300 | 50 | 5 | 15 | 10 | 2 |
| control | 6 | 325 | 70 | 0 | 25 | 52 | 12 |

Large open areas (10 μm wide) and contacts were inspected in the center and edge of every wafer by SEM analysis. No grass was seen under any of the 16 test conditions. Grass was seen in the contacts (>0.8 μm) and trenches (>0.4 μm) in the control wafer in which no O₂ was used during flash striking.

Obviously, numerous modifications and variations of the present invention are possible in light of the above teachings. It is therefore to be understood that within the scope of the appended claims, the invention may be practiced otherwise than as specifically described herein.

What is claimed is:

1. A method for plasma etching comprising:
  i) flash striking in a plasma etching apparatus a mixture comprising an etching gas and an oxygen source to form a plasma;
  ii) reducing a flow of said oxygen source into said apparatus prior to substantial etching; and
  iii) etching a dielectric material with said plasma,
  wherein a concentration of oxygen in said mixture is greater than a concentration of oxygen in said plasma during etching.

2. The method of claim 1, wherein said dielectric layer comprises $SiO_2$ doped with Boron and/or Phosphorous.

3. The method of claim 1, wherein said dielectric layer is BPTEOS.

4. The method of claim 1, wherein said concentration of oxygen is from 1% to 10% by volume of said mixture.

5. The method of claim 1, wherein a power during etching is 250–1000 watts.

6. The method of claim 1, wherein a pressure during etching is 50–90 mTorr.

7. The method of claim 1, wherein said etching gas comprises $CHF_3$ and $C_nF_xH_y$, wherein $n \leq 4$, $y \leq 2$, and $x=(2n+2)-y$ or $2n-y$.

8. The method of claim 1, further comprising introducing a polymer forming gas into said apparatus during said etching step.

9. The method of claim 8, wherein said polymer forming gas is a hydrofluorocarbon.

10. The method of claim 8, wherein said polymer forming gas is a $C_{1-4}$ hydrofluorocarbon.

11. The method of claim 8, wherein said polymer forming gas is F-134a.

12. The method of claim 1, wherein said etching apparatus is selected from the group consisting of a diode etcher, a triode etcher, a HDP reactor, a microwave etching apparatus and a MERIE etcher.

13. A method of operating a plasma etching apparatus comprising:
  i) flash striking a mixture comprising an etching gas and an oxygen source to form a plasma;
  ii) reducing a flow of said oxygen source into said apparatus prior to substantial etching; and
  iii) etching a dielectric material in said plasma etching apparatus with said plasma,
  wherein a concentration of oxygen in said mixture is greater than a concentration of oxygen in said plasma during etching.

14. The method of claim 13, wherein said etching apparatus is selected from the group consisting of a diode etcher, a triode etcher, a HDP reactor a microwave etching apparatus and a MERIE etcher.

* * * * *